(12) United States Patent
Chevallier

(10) Patent No.: US 6,324,094 B1
(45) Date of Patent: Nov. 27, 2001

(54) APPARATUS FOR READING STATE OF MULTISTATE NON-VOLATILE MEMORY CELLS

(75) Inventor: Christophe J. Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/560,994

(22) Filed: Apr. 28, 2000

Related U.S. Application Data

(63) Continuation of application No. 09/200,001, filed on Nov. 25, 1998, now Pat. No. 6,078,518, which is a continuation of application No. 09/030,219, filed on Feb. 25, 1998, now Pat. No. 5,912,818, which is a continuation of application No. 08/736,194, filed on Oct. 24, 1996, now Pat. No. 5,790,453.

(51) Int. Cl.[7] ....................................... G11C 7/02
(52) U.S. Cl. .............. 365/185.03; 365/208; 365/185.03; 365/185.2; 365/185.22; 365/185.18
(58) Field of Search ..................... 365/185.01, 189.01, 365/208, 185.33, 185.03, 185.2, 185.22, 185.18

(56) References Cited

U.S. PATENT DOCUMENTS

| | | | |
|---|---|---|---|
| 5,608,676 | * 3/1997 | Medlock et al. | 365/189.09 |
| 5,754,469 | * 5/1998 | Hung et al. | 365/185.03 |
| 5,768,184 | 6/1998 | Hayashi et al. | 365/185.03 |
| 5,768,191 | * 6/1998 | Choi et al. | 365/185.22 |
| 5,768,287 | 6/1998 | Norman et al. | 371/21.2 |
| 5,771,346 | 6/1998 | Norman et al. | 395/183.18 |
| 5,790,453 | * 8/1998 | Chevallier | 365/185.03 |
| 5,903,504 | 5/1999 | Chevallier et al. | 365/207 |
| 5,909,390 | 6/1999 | Harari | 365/185.03 |
| 5,910,914 | * 6/1999 | Wang | 365/185.21 |
| 5,912,838 | * 6/1999 | Chevallier | 365/185.03 |
| 5,930,167 | * 7/1999 | Lee et al. | 365/185.03 |
| 6,016,268 | * 11/2000 | Worley | 365/149 |
| 6,075,738 | * 6/2000 | Takano | 365/210 |
| 6,078,578 | * 6/2000 | Chevallier | 365/185.03 |

* cited by examiner

Primary Examiner—Viet Q. Nguyen
(74) Attorney, Agent, or Firm—Schwegman, Lundberg, Woessner & Kluth, P.A.; E. E. Drake

(57) ABSTRACT

An apparatus for determining the state of a multistate memory cell. The apparatus includes three sense amplifiers, each with an associated reference cell which produces a reference voltage for input to each of the sense amplifiers. The apparatus includes circuitry which allows the reference cell currents to be varied to produce the reference voltages or pairs of reference voltages needed to accurately determine the threshold voltage and hence state of a programmed or erased memory cell.

21 Claims, 9 Drawing Sheets

APPARATUS FOR READING STATE OF MULTISTATE NON-VOLATILE MEMORY CELLS

This application is a continuation of U.S. Ser. No. 09/200,001 filed Nov. 25, 1998, now U.S. Pat. No. 6,078, 518, which is a continuation of U.S. Ser. No. 09/030,219 filed Feb. 25, 1998, now U.S. Pat. No. 5,912,838 which is a continuation of U.S. Ser. No. 08/736,194 filed Oct. 24, 1996, now U.S. Pat. No. 5,790,453.

TECHNICAL FIELD

The present invention relates to non-volatile memory systems, and more specifically, to circuitry for determining the state of a multistate memory cell contained in such a system.

BACKGROUND OF THE INVENTION

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon manufacturing larger die which contain more memory cells or using improved photolithography techniques to build smaller memory cells. Reducing the size of a memory cell allows more cells to be placed on a given area of a single die.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to a floating gate. The amount of charge residing on the floating gate determines the voltage required on the control gate to cause the device to conduct current between the source and drain regions. This voltage is termed the threshold voltage, $V_t$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at the given set of applied voltages, the state of the cell (programmed or erased) can be found.

A multi-bit or multistate flash memory cell is produced by creating multiple, distinct threshold voltage levels within the device. Each distinct threshold voltage level corresponds to a value of a set of data bits, with the number of bits representing the amount of data which can be stored in the multistate cell. This method allows multiple bits of binary data to be stored within the same memory cell. When reading the state of the memory cell, the threshold voltage value or range of values for which the memory cell conducts current (as determined by comparison with a sense amplifier having a preselected reference value) corresponds to a binary decoded value representing the programmed data. The threshold voltage level for which the cell conducts thus corresponds to a bit set representing the data programmed into the cell. Proper data storage requires that the multiple threshold voltage levels of a multistate memory cell be separated from each other by a sufficient amount so that a level of a cell can be programmed or erased in an unambiguous manner. The specific relationship between the data programmed into the memory cell and the threshold voltage levels of the cell depends upon the data encoding scheme adopted for the cells.

In programming a multistate memory cell, the objective is to apply a programming voltage over a proper time period to store enough charge in the floating gate to move the threshold voltage to a desired level. This level represents a state of the cell corresponding to an encoding of the data which is to be programmed into the cell. However, division of the threshold voltage range for a two state (one bit) cell into multiple threshold voltage levels reduces the margin (threshold voltage difference) between levels. This necessitates tighter system design tolerances and reduced programming verification noise margins so that adjacent levels can be differentiated and programming errors reduced. However, the tightening of the programming and read operation threshold voltage windows leads to slower programming procedures and introduces another potential source of memory system errors.

U.S. Pat. No. 5,043,940, entitled "Flash EEPROM Memory Systems Having Multistate Storage Cells", issued Aug. 27, 1991, describes a method of programming a multistate memory cell in which an iterative read-compare-program cycle is executed. During the cycle, the data intended to be programmed into a memory cell is input to a comparator, along with the outputs from a set of sense amplifiers (each having a different reference voltage) connected to the cell. The output of the sense amplifiers indicates the threshold voltage level to which the cell is programmed. This corresponds to a read operation. If the threshold voltage level of the cell corresponds to the encoded representation of the intended data, then the cell is in the correct state.

However, the disclosure of the '940 patent fails to discuss how the values of the reference voltages are generated and controlled to generate one of the inputs for the sense amplifiers. This is an important detail because an accurate determination of the state of a memory cell during a program verification, erase verification, or read operation depends on the ability to precisely control the value of the reference voltages input to the sense amplifiers. This is particularly true in the case of multistate memory cells where determination of the state of a cell may require knowing that the cell's threshold voltage is greater than one reference value, but below a second reference value, i.e, the threshold voltage of the cell is within a predetermined range of values.

Control of the reference voltage values is also important because the range of threshold voltages which indicate a particular state of a memory cell depends on the memory system operation being carried out, and may vary with ambient conditions such as bias and temperature.

What is desired is an apparatus for determining the state of a multistate memory cell during a programming verify, erase verify, or read operation which allows accurate control of the reference voltages used as inputs to the sense amplifiers which determine the threshold voltage of the memory cell.

SUMMARY OF THE INVENTION

The present invention is directed to an apparatus for determining the state of a multistate memory cell. The apparatus includes a plurality of sense amplifiers, each with an associated reference cell which produces a reference voltage for input to each of the sense amplifiers. The apparatus includes control circuitry which allows the reference cell currents to be varied to produce the reference voltages or pairs of reference voltages needed to accurately determine the threshold voltage and hence state of a programmed or erased memory cell.

Further objects and advantages of the present invention will become apparent from the following detailed description and accompanying drawings.

BRIEF DESCRIPTION OF THE INVENTION

Figure 1:
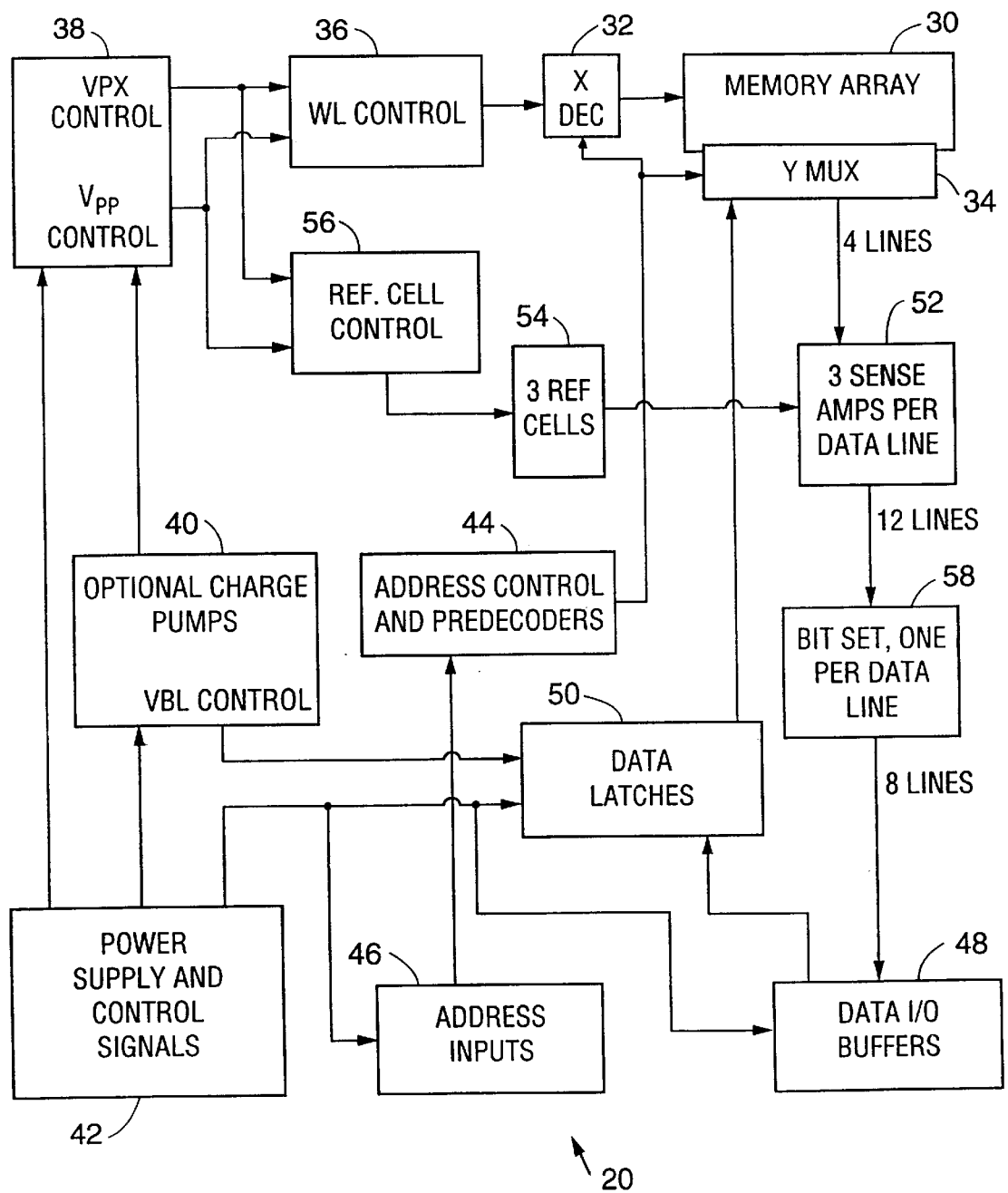
FIG. 1 is a block diagram showing the primary functional units of a memory system incorporating the memory cell read circuitry of the present invention.

FIG. 1 is a block diagram showing the primary functional units of a memory system 20 incorporating the memory cell read circuitry of the present invention. The central component of memory system 20 is memory array 30 which consists of a plurality of memory cells arranged into rows and columns. The rows are referred to as "word lines" and the columns are referred to as "bit lines".

X-decoder block 32 contains circuitry which decodes data representing an address of a memory cell within memory array 30 and applies the proper voltage for the memory system operation to the word line corresponding to the row in which the memory cell is located. Similarly, Y-multiplexer block 34 contains circuitry which decodes the address of the memory cell within memory array 30 and applies the proper voltage for the memory system operation to the bit line corresponding to the column in which the memory cell is located.

Word line control block 361 (labelled "WL control" in the figure) contains circuitry which permits a precise adjustment of the voltage applied to a word line during the various memory system operations. A circuit suited for use in controlling the word line voltages is described in the commonly assigned U.S. patent application No. 08/640,456, filed May 1, 1996, and entitled "OP Amp Circuit With Variable Resistance and Memory System Including Same", the contents of which is hereby incorporated by reference.

Vpp (write/erase supply voltage) and VPX (word line voltage) control block 38contains circuitry for generating and/or controlling the voltages used for the word lines and other elements of the memory system during programming and erase operations. In some cases these voltages may be produced by a charge pump 40 which generates the voltage from a supply voltage supplied by power supply 42. Charge pump block 40 also contains circuitry for controlling the voltages applied to bit lines of the memory array (labelled "VBL" in the figure) during programming operations.

Address control and predecoder block 44 contains circuitry which produces the address of a memory cell is based on data or signals supplied by address input block 46, after generating intermediate signals used to drive x-decoder 32 and y-multiplexer 34.

Data I/O buffer block 48 contains buffer circuitry used to receive input data supplied from an external source to memory system 20 during a programming operation, or to output data during a read operation. Data latches 50 are used to store and buffer input data during a programming operation. A state machine (not shown) is typically used to control the sequencing of the stages of the operations performed on the cells contained in memory array 30.

During a read operation, three sense amplifiers 52 are used in conjunction with the reference voltage supplied by three reference cells 54 to determine the state of a memory cell contained in memory array 30. Reference cells 54 are typically implemented in the form of memory cells of the type found in array 30. Reference cell control block 56 contains circuitry used to control the reference voltage supplied by cells 54 and input to each of the sense amplifiers. This enables the reference voltage to be varied in accordance with the requirements of the memory system operation being implemented. The output of sense amplifiers 52 is supplied to sense amplifier logic block 58 (labelled "bit set" in the figure) which determines the bit values corresponding to the sensed state of the memory cell, and allows the values read out of the sense amplifiers to be encoded into a set of two bits of data.

As has been discussed, each of the threshold voltage levels in a multistate memory cell corresponds to a different state of the cell. Each state in turn is represented by a logic value or bit set having one of four values. The precise logic value corresponding to any particular threshold voltage value depends on the encoding scheme chosen for the data to be programmed into the memory cells. An example of an encoding scheme, including the logic values, the corresponding threshold voltage values (cell $V_t$), and the state of the memory cell is shown in table 1 below.

TABLE 1

| Cell $V_t$ | State | logic value (bit set) |
|---|---|---|
| less than 3 V | erased | 1 1 |
| 4 to 4.5 V | programmed state A | 1 0 |
| 5 to 5.5 V | programmed state B | 0 0 |
| greater than 6 V | programmed state C | 0 1 |

As shown in the table, a multistate cell in which two bits are used to define each state will have four possible states or threshold voltage levels. In contrast, a standard one bit memory cell will have only two possible states or threshold voltage levels. Thus, in a memory cell storing only one bit of data, it is much easier to precisely determine the state of the cell. This is because there is significantly more margin for error allowed when determining the cell's threshold voltage value.

To ensure that a memory cell has a threshold voltage level within a specified range of $V_t$ values, it is necessary that the circuitry check that the cell's $V_t$ be above a certain value and below a second value, with the two values defining the $V_t$ range depending upon the memory system operation being implemented. Although a memory cell is expected to have a certain $V_t$ value when read, in order to trip the sense amplifiers in the expected way, the cell is programmed and verified at a slightly higher $V_t$ value. This allows for variations in the cell threshold voltage level over time due to oxide leakage or disturbs arising from the programming or reading of adjacent cells.

For example, based on the previous encoding scheme, the bit set "1 0" should be attributed to a memory cell having a $V_t$ between 4.0 and 4.5 volts right after being programmed. This corresponds to what is termed a "programming verify" operation. The circuitry of the present invention for determining the state of a multistate memory cell would check whether the cell's $V_t$ was both above 4.0 volts and below 4.5 volts. This verifies that the programming operation was correctly carried out. However, after time the $V_t$ value may shift slightly, so that its threshold voltage may be above 4.5 volts or below 4.0 volts. Thus, when performing a "read" operation at this time, it is beneficial to allow the range of $V_t$ values corresponding to the state "1 0" to vary somewhat, as long as the states of the cell can still be determined unambiguously. In the case being discussed, the present invention will set the $V_t$ trip point values (which define the limits of the range of $V_t$ for which the cell is in the state represented by the range) to be 3.7 volts and 4.7 volts for this situation. Referring back to Table 1, it is apparent that the read operation voltage values (trip points) are set to be between the upper limit of a first threshold voltage range and the lower limit of a second threshold voltage range, where the lower limit of the second range is greater than the upper limit of the first range.

This example can be extended to cover all of the possible bit set values for a multistate memory cell containing two bits (four $V_t$ levels). This means that the read circuitry needs to be capable of operating with the following reference voltage values (trip points): 3.0, 3.7, 4.0, 4.5, 4.7, 5.0, 5.5, 5.7, and 6.0 volts. Note that this set of values corresponds to the data encoding scheme for a two-bit cell described previously, with an allowed threshold voltage variance during a read operation of −0.3 and +0.2 volts. Other encoding schemes for cells containing a greater number of bits and different allowed voltage shifts can of course be implemented by one skilled in the art by following the description contained in this document.

The threshold voltage values listed form a set of nine trip points. A simple implementation of the read circuitry would thus require nine reference cells and nine sense amplifiers. This is inefficient, as it requires excessive space on the memory system chip and the use of pre-set values for the reference cells may limit the performance of the system.

It is noted that it is not necessary to have the capability of performing sensing operations with the nine reference values at the same time or during the same memory system operation cycle. During a programming verify operation performed soon after a cell has been programmed, it is necessary to check the cell's threshold voltage level with respect to the following trip points: 4.0, 4.5, 5.0, 5.5, and 6.0 volts, with the trip points being used in pairs to define the threshold voltage ranges. However, during a read operation performed at a later time, it is necessary to check the cell's threshold voltage level with respect to the following trip points: 3.7, 4.7, and 5.7 volts.

The read operation may be performed often on a large number of programmed cells. Therefore, it is necessary that it be carried out quickly so as to provide a commercially reasonable access time for the memory system. On the other hand, the verify operation is part of the programming cycle. The programming operation involves application of a programming pulse, which typically has a period of a few microseconds. Since each read cycle requires tens of nanoseconds, use of two read cycles to perform the verification function does not affect the overall programming time for the system. In accordance with this analysis, the present invention utilizes a one-cycle read for the read operation for a cell, and a two-cycle read for the programming verify operation. During the second cycle of the two-cycle read used for the verify operation, the threshold voltages for the reference cells are changed to a second set of values. It is noted that the outputs of each of the sense amplifiers are produced at substantially the same time, that is during the same read (sensing) cycle. This allows a determination of the memory cell threshold voltage range (or lower or upper limit of that range in the case of a verification operation) during a single sensing cycle. This is in contrast to a memory cell read apparatus which determines the range or limit by sequentially testing the memory cell threshold voltage against a series of reference values during multiple sensing cycles.

In accordance with the present invention, the threshold voltage trip points for the read, programming verify, and erase verify operations are shown in table 2 below:

TABLE 2

| Operation | First Read Cycle $V_t$ Trip Point(s) | Second Read Cycle $V_t$ Trip Point(s) |
|---|---|---|
| Read | 3.7, 4.7, 5.7 V | — |
| Programming verify | 4.0, 5.0, 6.0 V | 3.5, 4.5, 5.5 V |
| Erase verify | 3.0 V | — |

As indicated by table 2, the memory cell state is determined for a read operation using a single cycle read. Each of the three reference cells is set to one of the $V_t$ values shown. The circuitry determines whether the memory cell's $V_t$ is below 3.7 volts, between 3.7 and 4.7 volts, between 4.7 and 5.7 volts, or over 5.7 volts. This allows the current state of the memory cell to be determined. For the programming verify operation, two read cycles are used. During the first cycle, the reference cell $V_t$ values are set to 4.0, 5.0, and 6.0 volts. During the second cycle, the reference cell $V_t$ values are set to 3.5, 4.5, and 5.5 volts. The controller system reading and controlling memory system 20 then determines whether the memory cell's $V_t$ is below 3.5 volts, between 4.0 and 4.5 volts, between 5.0 and 5.5 volts, or over 6.0 volts.

The present invention uses three sense amplifiers and three reference cells to implement the memory cell read, programming verify, and erase verify operations for a four state multistate memory cell. The reference cells are initialized to a predetermined $V_t$ value. The gate of each reference cell is controlled to alter the amount of current flowing through the cell, thus modifying the effective $V_t$ of the reference cell. Reference cell control block 56 of FIG. 1 contains the circuitry which controls the voltage applied to the reference cell gate electrodes to select the desired $V_t$ trip points. Note that for purposes of the programming verify operation, six reference cells could be used. In such a situation, the verify operation can be carried out in a single read cycle.

The memory cell sensing (reading or state determination) method of the present invention uses a standard current sensing method. The memory cell is rendered conductive by applying 7 volts on the gate electrode, approximately 1 volt is applied to the drain, and the source is grounded. If the cell's threshold voltage level is below 7 volts, the cell will be conductive and current will flow from the drain to the source. This current is drawn from a resistor connected to $V_{cc}$, the system power supply (see block 42 of FIG. 1). As will be explained, the voltage value on the node of a resistor opposite to $V_{cc}$ indicates the current flowing through the memory cell.

Similar biasing conditions are applied to the reference cell(s). Another current to voltage converter circuit is used to apply the drain bias on the reference cell to produce an output voltage indicative of the current flowing through the reference cell. Typically, the reference cell current is on the order of tens of microampere.

The two output voltages from the current converters, one from the memory cell and a second from the reference cell, are compared using a differential amplifier. This forms the sense amplifier circuit. If the same current to voltage conversion circuit is used for the reference cell and the memory cell, the sense amplifier will trip when the reference cell $V_t$ and memory cell $V_t$ are substantially equal.

If the reference cell used to produce the reference current for the sense amplifier is similar to the memory cells in the array, then any process, temperature, or biasing variations will affect the reference cells in the same manner as the memory cells. This results in better performance across a range of conditions because tighter threshold voltage margins can be used for the read, program, and erase operations.

For the case of the two-bit (four $V_t$ level) memory cells being discussed, ten reference cell values are needed: 6 for programming operation verification, 3 for read operations, and 1 for erase operation verification. To generate these different $V_t$ values, several approaches can be used:
1. the $V_t$ of each reference cell can be adjusted to match a particular current, thus each reference cell would have a different threshold voltage value;
2. the gate electrode of the reference cells can be adjusted to match a particular current, thus each reference cell would have the same $V_t$, but different gate control voltages;
3. the ratio of current to voltage conversion for each reference cell can be adjusted, thus each reference cell would have the same $V_t$ and gate control voltages, but different converter circuits; or
4. using a single reference cell, mirror the output current into three or more current dividers having different ratios, thus producing a plurality of reference currents.

The first approach has the disadvantage that it requires extensive circuitry on the memory system chip for the programming, erasing, and reading of the reference cells to direct permit adjustment of the threshold voltage values.

Previously, the UV-erased value of a cell's $V_t$ was used for the reference cell $V_t$. This value arises during a UV-erase step which is part of the fabrication process for the cells. The UV-erase ensures that the cell's floating gate is empty of charges and that the $V_t$ is within a reasonable-range. However, with the continued improvements being made to the fabrication processes, process variations are more significant and the value of the UV-erased $V_t$ can vary significantly from part to part. This provides the motivation for being able to vary the reference cells' $V_t$ values.

The second approach has the disadvantage that the control gate voltage is not the same as the memory cell gate voltage. The control gate voltage adjustment can introduce undesirable threshold voltage variations due to biasing or process conditions. However, if these variations can be avoided or compensated for, then the reference cell current has the form:

$$Ids = B(Vgs - V_t)^2,$$

where

Ids is the drain to source current, or reference cell current;
B is a constant determined by the physical characteristics of the cell;
Vgs is the gate bias voltage; and
$V_t$ is the threshold voltage of the cell.

If a different gate voltage, given by Vgs1 is applied, where Vgs1 = Vgs + ΔV, then $$Ids1 = B(Vgs1 - V_t)^2 =$$

$$B(Vgs + \Delta V - V_t)^2 =$$

$$B(Vgs - (V_t - \Delta V))^2 =$$

$$B(VgS - V_{t1})^2,$$

where $$V_{t1} = V_t - \Delta V.$$

Thus, a change of +ΔV on the control gate corresponds to a change of −ΔV in the equivalent $V_t$ of the reference cell. This shows that gate control is a viable way of adjusting the "effective" threshold voltage ($V_{t1}$), without having to alter the "actual" threshold voltage ($V_t$) of the cell.

The third approach for generating the reference cell values has the disadvantage that a difference in circuitry between the memory array cell current to voltage converter and the reference cell converter introduces a biasing sensitivity to the memory cell state determination. The reference voltage produced in this manner could vary with the value of $V_{cc}$ (the primary power supply voltage).

The fourth approach has the disadvantage that the current mirrors and dividers are sensitive to process and biasing variations. In addition, the reference cell may not be biased in the same manner as the memory cells in the array, in order to pass the current in the first branch of the mirror.

As has been indicated, not all of the ten reference levels listed need to be available at one time. Since only three reference levels are used during any particular cycle, three reference cells having adjustable threshold voltage values can be used to generate the required levels.

Figure 2:
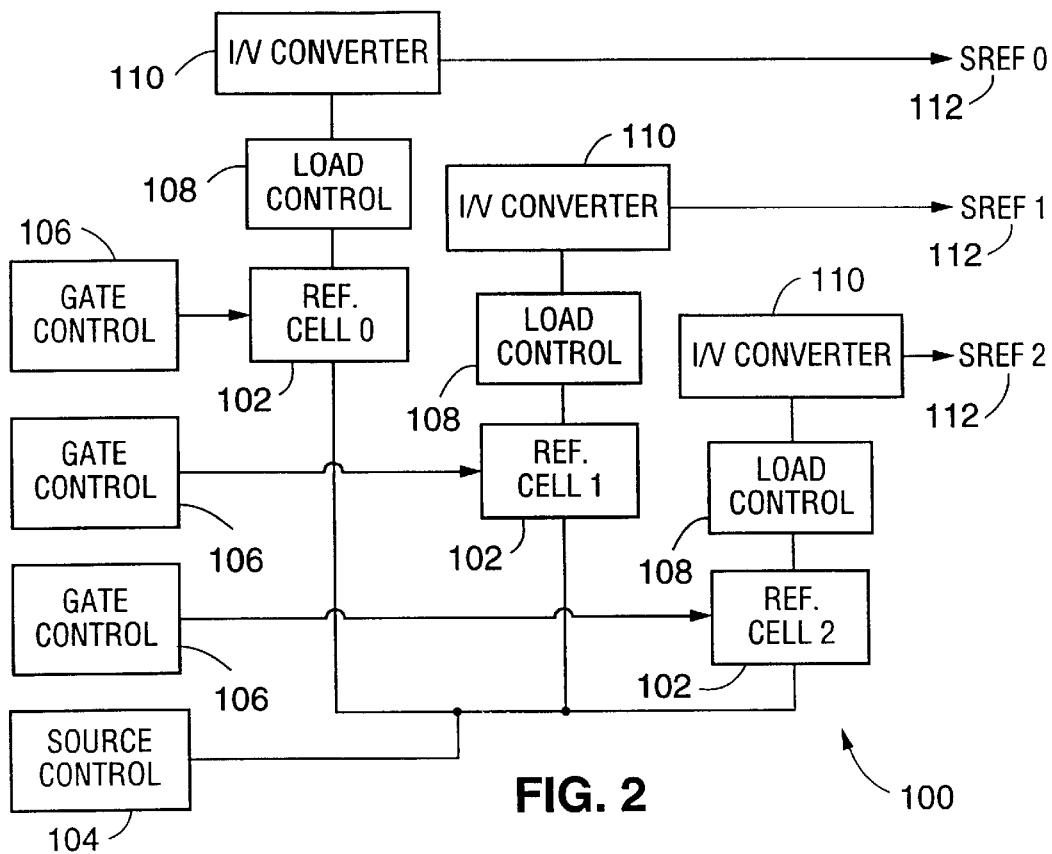
FIG. 2 is a block diagram showing the primary functional units of a first embodiment of a reference cell control circuit for use in the memory cell read circuitry of the present invention.

FIG. 2 is a block diagram showing the primary functional units of a first embodiment of a reference cell control circuit 100 for use in the memory cell read circuitry of the present invention. In reference cell control circuit 100, the threshold voltage of reference cells 102 can be adjusted to a desired value by means of source control block 104 and the other circuitry to be described. Source control block 104 is used to raise the source voltage during an erase operation. This has the effect of lowering the $V_t$ of the reference cells.

Gate control block(s) 106 are used to control the gate voltages of reference cells 102. The output of each reference cell 102 is put through load control circuitry 108 and a current-to-voltage converter 110 to produce the three reference voltages 112 (labelled "Sref 0, Sref 1, and Sref 2" in the figure). Gate control block(s) 106 and load control circuitry 108 are used to program the reference cells to a desired $V_t$ level. Thus, by using a combination of a global erase of the reference cells and selective programming of each individual reference cell, the $V_t$ level of the reference cells can be adjusted independently. This embodiment of the reference cell control module provides the flexibility to implement either approach 1 or 2 described previously.

Figure 3:
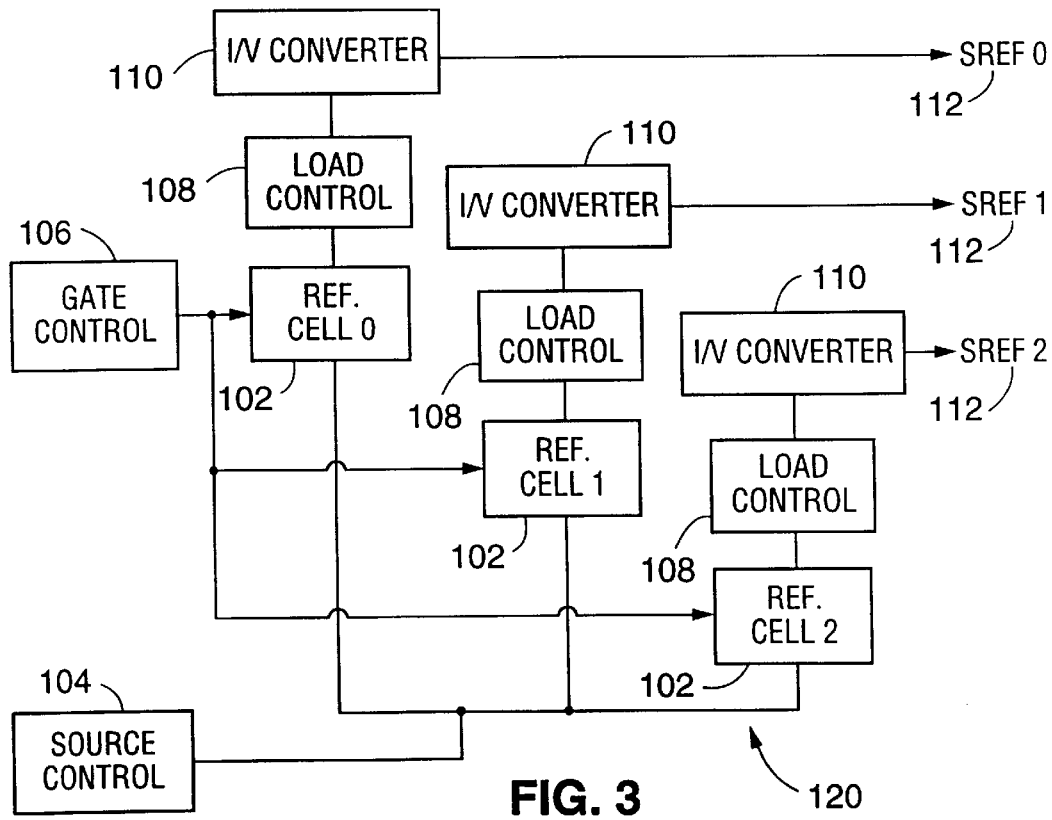
FIG. 3 is a block diagram showing the primary functional units of a second embodiment of a reference cell control circuit for use in the memory cell read circuitry of the present invention.

FIG. 3 is a block diagram showing the primary functional units of a second embodiment 120 of a reference cell control circuit for use in the memory cell read circuitry of the present invention. As with the circuit of FIG. 2, in reference cell control circuit 120, the threshold voltage of reference cells 102 can be adjusted by means of source control block 104 in combination with the other noted circuitry. Single gate control block 106 is used to control the gate voltages of reference cells 102. The output of each reference cell 102 is put through load control circuitry 108 and a current-to-voltage converter 110 to produce the three reference voltages 112. Source control block 104 is again used to raise the source voltage during an erase operation, thereby lowering the $V_t$ of the reference cells, and gate control block 106 and load control circuitry 108 are used to program the reference cells to a desired $V_t$ level. This embodiment has the advantage that only one gate control block is needed, so the circuit can be implemented in a smaller form.

Figure 4:
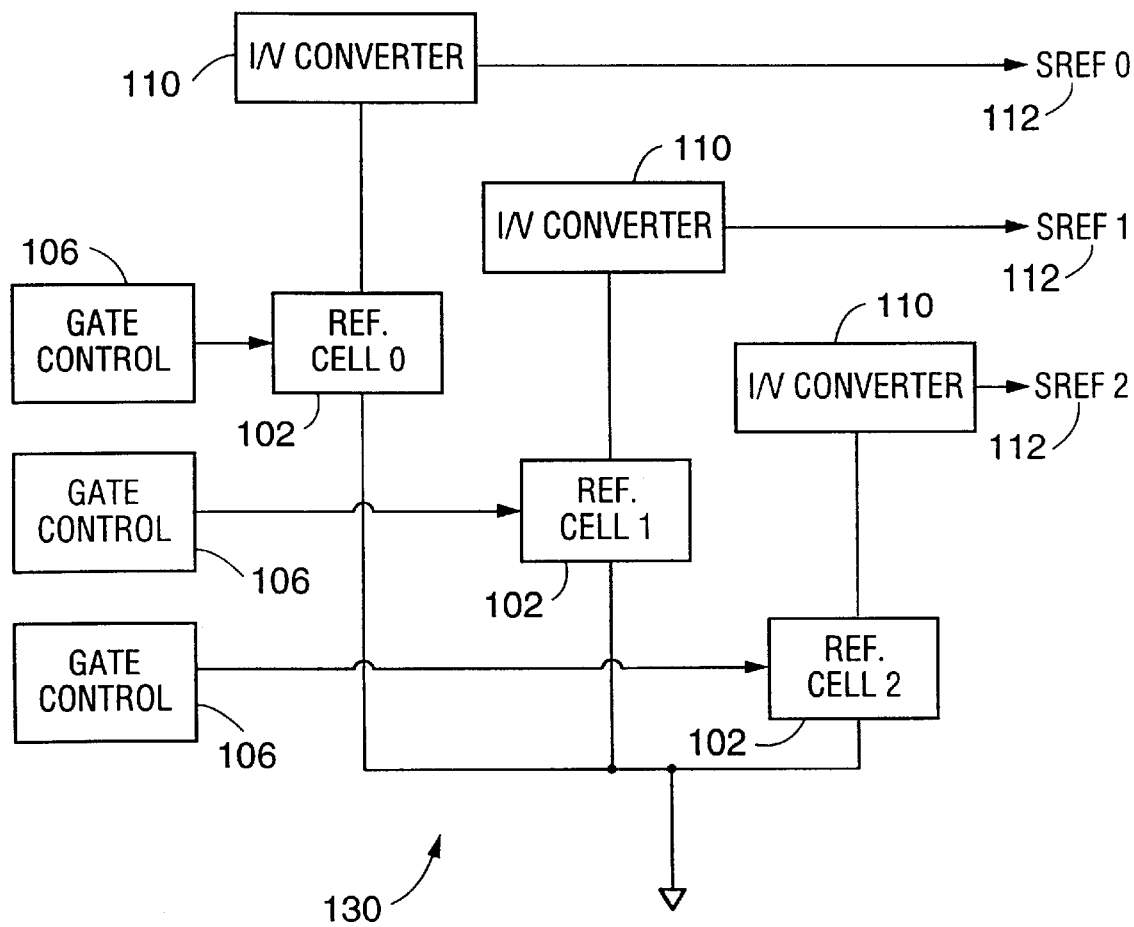
FIG. 4 is a block diagram showing the primary functional units of a third embodiment of a reference cell control circuit for use in the memory cell read circuitry of the present invention.

FIG. 4 is a block diagram showing the primary functional units of a third embodiment 130 of a reference cell control circuit for use in the memory cell read circuitry of the present invention. In reference cell control circuit 130 the threshold voltage of reference cells 102 is approximately the same (typically the UV-erased value). Gate control blocks 106 are used to control the gate voltages of reference cells 102. The output of each reference cell 102 is put through a current-to-voltage converter 110 to produce the three reference voltages 112. This embodiment has the advantage that no source control or load control is needed, since the reference cell $V_t$ values are assumed to be the same.

Table 3 shows the reference cell threshold voltages, gate voltage variations, $\Delta Vi$, and resulting trip point and gate voltages of the three reference cells for the reference cell control circuit of FIG. 3. Note that in this embodiment the gate $\Delta V$ voltage(s) are the same for each reference cell for a given operation, while the cells' actual $V_t$ (as opposed to effective) is varied.

TABLE 3

| Operation | $\Delta V0$ | $\Delta V1$ | $\Delta V2$ | Trip Points | Gate Voltages (assuming WL = 7 V) | | |
|---|---|---|---|---|---|---|---|
| | | | | | $Ref_0$ | $Ref_1$ | $Ref_2$ |
| Ref Cell $V_t$ | 2 V | 3 V | 4 V | | | | |
| Program 1 verify | −2 | −2 | −2 | 4.0/5.0 /6.0 | 5 | 5 | 5 |

TABLE 3-continued

| Operation | $\Delta V0$ | $\Delta V1$ | $\Delta V2$ | Trip Points | Gate Voltages (assuming WL = 7 V) | | |
|---|---|---|---|---|---|---|---|
| | | | | | $Ref_0$ | $Ref_1$ | $Ref_2$ |
| Program 2 verify | −1.5 | −1.5 | −1.5 | 3.5/4.5 /5.5 | 5.5 | 5.5 | 5.5 |
| Read | −1.7 | −1.7 | −1.7 | 3.7/4.7 /5.7 | 5.3 | 5.3 | 5.3 |
| Erase | −1 | X | X | 3.0/—/— | 6 | 6 | 6 |

Table 4 shows the reference cell threshold voltages, gate voltage variations, $\Delta Vi$, and resulting trip point and gate voltages of the three reference cells for the reference cell control circuit of FIG. 2 or FIG. 4. Note that in this embodiment the gate $\Delta V$ voltage(s) for different reference cells are varied for a given operation, while the cells' actual $V_t$ (as opposed to effective) remains constant.

TABLE 4

| Operation | $\Delta V0$ | $\Delta V1$ | $\Delta V2$ | Trip Points | Gate Voltages (assuming WL = 7 V) | | |
|---|---|---|---|---|---|---|---|
| | | | | | $Ref_0$ | $Ref_1$ | $Ref_2$ |
| Ref Cell $V_t$ | 2 V | 2 V | 2 V | | | | |
| Program 1 verify | −2 | −3 | −4 | 4.0/5.0 /6.0 | 5 | 4 | 3 |
| Program 2 verify | −1.5 | −2.5 | −3.5 | 3.5/4.5 /5.5 | 5.5 | 4.5 | 3.5 |
| Read | −1.7 | −2.7 | −3.7 | 3.7/4.7 /5.7 | 5.3 | 4.3 | 3.3 |
| Erase | −1 | X | X | 3.0/—/— | 6 | — | — |

The architectures shown, which use three sense amplifiers, can be extended to greater numbers for memory cells having a greater storage capacity (e.g., 7 sense amps for a cell having 8 threshold voltage levels, corresponding to a bit set of three bits or 15 sense amps for 16 threshold voltage levels, corresponding to a bit set of four bits).

Figure 5:
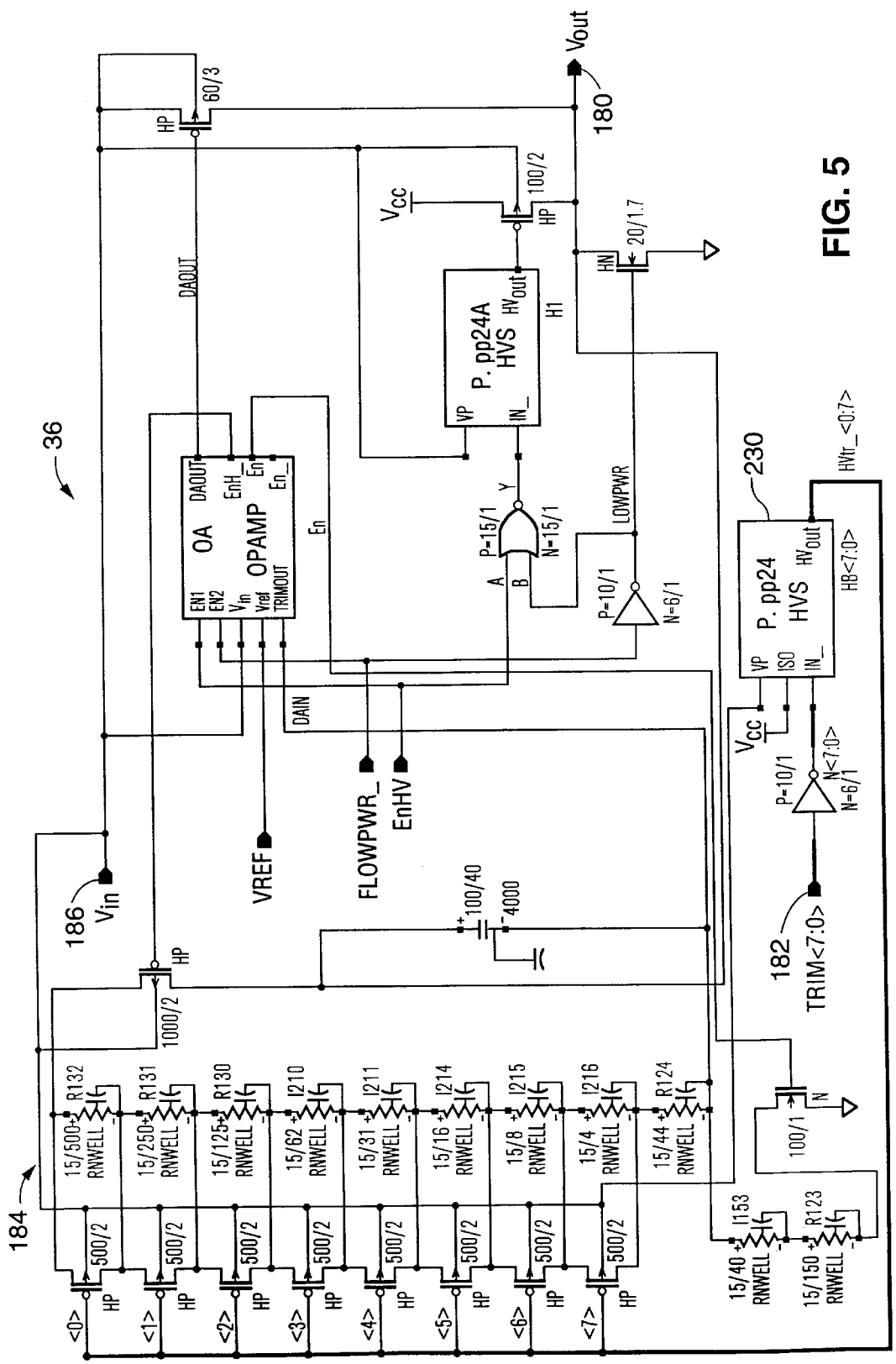
FIG. 5 is a schematic for the wordline control circuit shown in the block diagram of FIG. 1.

FIG. 5 is a schematic for the wordline control circuit 36 shown in the block diagram of FIG. 1. As mentioned, the structure and operation of this circuit is described in U.S. patent application No. 08/640, 456, filed May 1, 1996, entitled "OP Amp Circuit With Variable Resistance and Memory System Including Same".

The circuit of FIG. 5 is used to vary the wordline voltage present at $V_{out}$ 180 in response to a set of input control bits (labelled "trim<7:0>" in the figure). Control bits 182 are typically generated by a controller such as the state machine which is part of the memory system. Bits 182 cause the transistor elements in resistance ladder 184 to be selectively turned on or off. This controls whether current flows through each of the resistive elements in ladder 184, where these resistive elements may be implemented in the form of transistors or passive resistor elements. Use of control bits 182 to vary the resistance of ladder 184 causes wordline control circuit 36 to vary $V_{in}$ 186 so as to produce $V_{out}$ 180. This permits control of the wordline voltage applied to a row of memory cells in the array in response to the asserted values of control bits 182.

Figure 6:
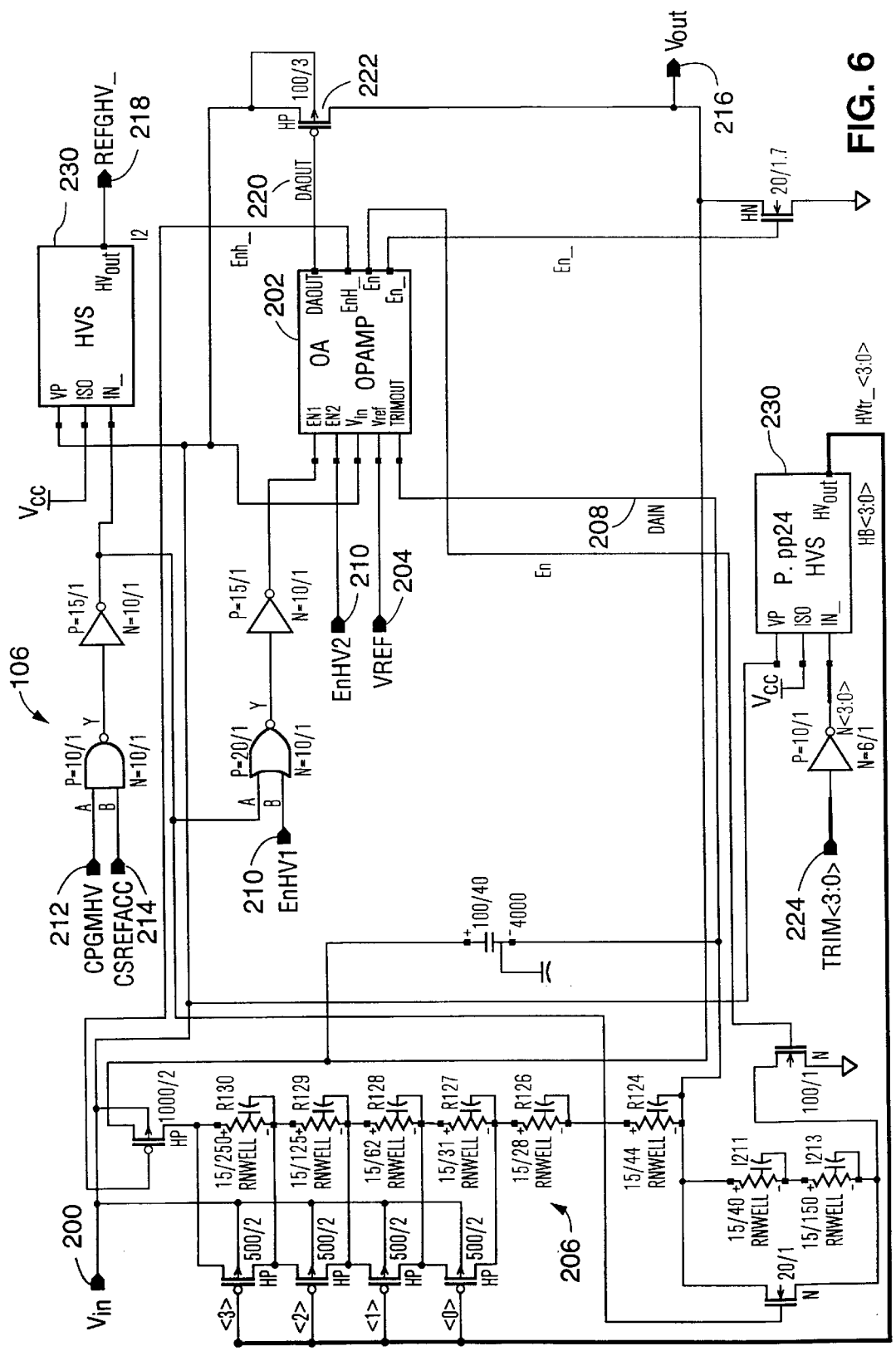
FIG. 6 is a schematic for the reference cell gate control circuit shown in FIGS. 2–4.

FIG. 6 is a schematic for reference cell gate control circuit 106 shown in FIGS. 2–4. This circuit permits the gate voltage, and hence threshold voltages of the reference cells to be adjusted as needed to set the trip points used for the various memory system operations. $V_{in}$ (signal 200) is the voltage supply for most of the circuitry. It can be provided by an external power supply (typically 12 V), or it may be generated by an on-chip charge pump. The circuit of FIG. 6 acts to vary $V_{in}$ in accordance with the value of control bits 224 (labelled "trim<3:0>" in the figure) to produce the various values of $V_{out}$ 216.

$V_{in}$ supplies the power for operational amplifier 202 which is mounted as a voltage multiplier. Reference voltage, Vref 204, is typically two volts and is supplied to the non-inverting input of operational amplifier 202. Output 208 of resistance divider 206 on the drain node is connected to the inverting input (labelled "trimout" in the figure) of amplifier 202. Resistance ladder 206 is composed of transistors which control the flow of current through a set of resistance elements, where the resistive elements may be implemented in the form of transistors or passive resistors. Control bits 224 cause the transistor elements in resistance ladder 206 to be selectively turned on or off. This controls whether current flows through each of the resistive elements in ladder 224.

Control bits 224 may be supplied by a controller such as the state machine which forms part of the memory system. As the state machine causes the stages of the programming, erase, or read operations to be implemented on a memory cell in the array, the appropriate control bits 224 corresponding to the stages can be generated. This will cause the reference cell threshold voltages to be adjusted to the levels required for performing the programming verify, erase verify, or read operations.

Operational amplifier 202 is enabled by enable signals EnHV1 or EnHV2 210, or the combination of program command signal CPgmHV 212 and reference cell access signal CSrefacc 214. This second set of enabling signals is used during the programming of the reference cells which sets the threshold voltage of those cells.

As noted, trim values 224 are used to control the value of $V_{out}$ 216 by changing the resistance ratio of the voltage multiplier (operational amp 202). The trim values shown permit varying $V_{out}$ 216 between three and seven volts. Since the construction of the word line control and reference cell control circuits are similar, parameters such as process variations, temperature, or biasing conditions will affect both circuits in a similar manner. As a result, the memory cells and the reference cells are affected by these variations in the same way, and the differential sense amplifier will not be sensitive to these "common" variations.

The trim values used to implement the various embodiments of reference cell gate control circuit 106 can be stored on the memory system chip in non-volatile memory elements, hard-wired, or loaded into a register by the system controller at the appropriate time. Assertion of the desired trim values 224 causes $V_{out}$ 216 to vary, thus providing a means for changing the gate voltage applied to the reference cells. This has the effect of changing- the threshold voltage level of the reference cells, thereby providing a variable source for the comparison voltage used by a sense amplifier to determine the state of a memory cell. Signal RefGHV_ 218 is a high voltage control signal used to control the operation of load control circuit 108 which will be described later with reference to FIG. 9.

When the circuit of FIG. 6 is disabled (none of the enabling signals are high), $V_{out}$ is grounded. This produces the erase conditions for the reference cells. When the signals to program the cell, CPgmHV 212, and access the reference cell, CSrefacc 214, are high, resistor divider 206 is shunted so that operational amplifier 202 output daout 220 is close to ground. This turns on output transistor 222, bringing $V_{out}$ 216 to the level of $V_{in}$ 200. The resulting high voltage on the gate of the reference cell (which is connected to $V_{out}$ 216) is used when programming the reference cell to a desired threshold voltage level.

It is noted that a full resistive ladder having a greater number of trims could also be used in the place of resistor divider 206. This has been avoided in the embodiments of FIGS. 2, 3, and 4 in order to conserve space. This is particularly important for the examples of FIGS. 2 and 4 since those embodiments use three gate control circuits.

As noted, the reference cells are similar to the memory cells in the array, and have dummy cells surrounding the active reference cells to reduce border effects. The more similar the reference cells are to standard memory cells (in terms of physical conditions, etc.), the better the match to the memory cells will be, and the more accurate the sensing results. This is especially important in the case of multistate cells because the $V_t$ windows between logic states are narrow.

Figure 7:
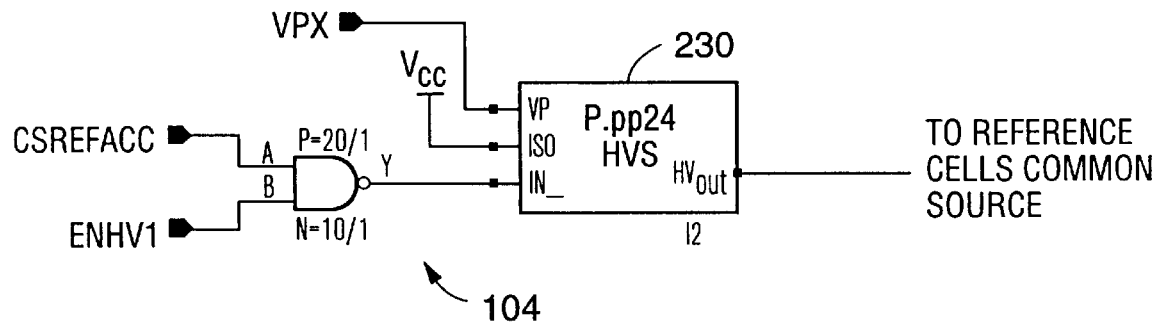
FIG. 7 is a schematic for the source control circuit shown in FIGS. 2 and 3.

FIG. 7 is a schematic for source control circuit 104 shown in FIGS. 2 and 3. Source control circuit 104 is a high voltage switch with output HVout at ground level (for read and program operations) unless both of the input signals CSrefacc and EnHV1 are high. CSrefacc is a signal which is high when the reference cells' $V_t$ values are being adjusted. Signal ENHV1 is used in this circuit to trigger performance of an erase operation on the reference cells by passing the erase supply voltage (VPX).

Figure 8:
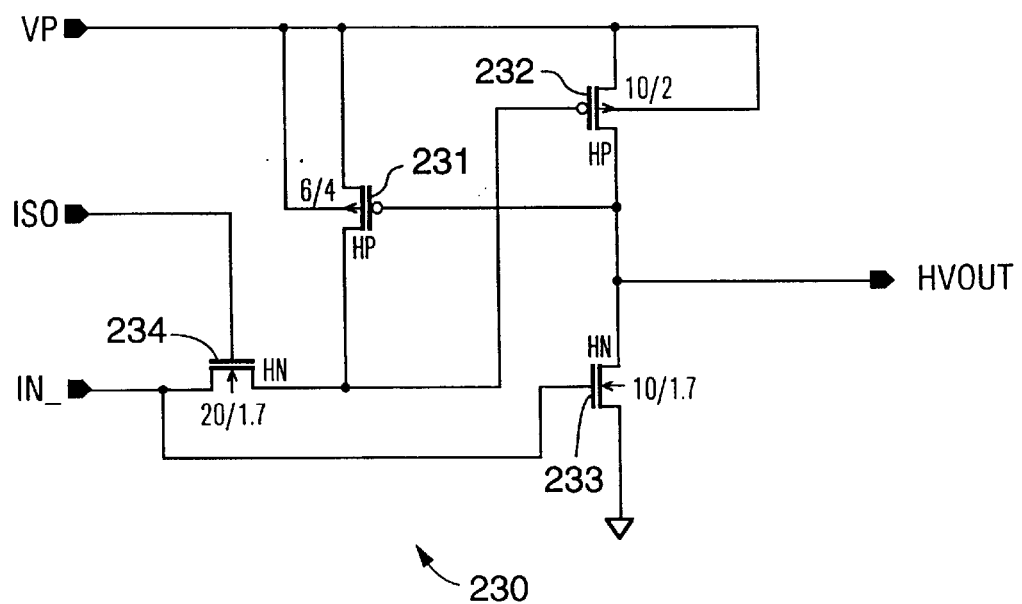
FIG. 8 is a schematic for the high voltage switch circuit shown in the block diagram of FIGS. 5, 6, and 7.

FIG. 8 is a schematic for high voltage switch circuit(s) 230 shown in the schematic diagrams of FIGS. 5, 6, and 7. High voltage switch circuit 230 is used to generate a signal which varies between a value of VP and ground from a signal at level $V_{cc}$. The half-latch formed from transistors 231, 232, and 233 is set with VP at $V_{cc}$, when IN_ toggles. Then, when VP is raised from $V_{cc}$ to its nominal higher value, the output HVout becomes either VP or ground, depending on IN_. Transistor 234 serves as an isolation device when VP is high.

Figure 9:
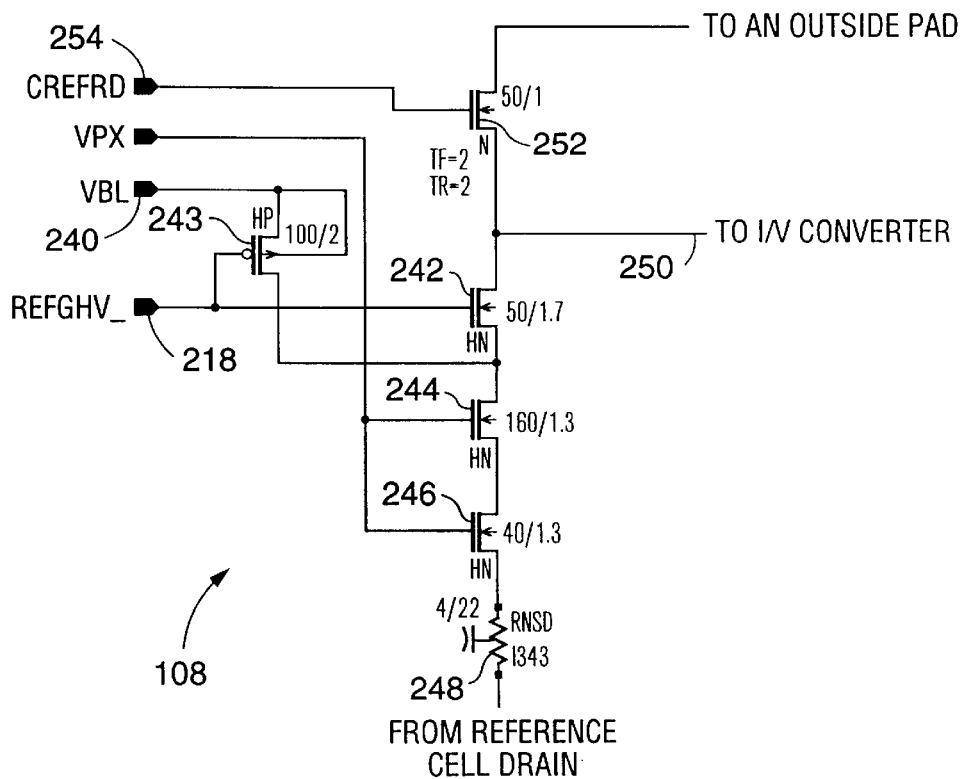
FIG. 9 is a schematic for the load control circuit shown in FIGS. 2 and 3.

FIG. 9 is a schematic for load control circuit 108 shown in FIGS. 2 and 3. Load control circuit 108 is used to provide a load on the reference cell output which simulates the load of a cell in the memory array. This serves to match the loads on the two types of cells, thereby providing a reference cell voltage for input to the sense amplifier which more accurately reflects the conditions under which the memory cell threshold voltages are measured.

Load control circuit 108 passes VBL 240, the programming voltage, to the drain of a reference cell during a reference cell programming operation. Signal RefGHV_ 218, generated by reference cell control circuit 106 of FIG. 6, goes low during a programming operation, turning on PMOS transister 243 and turning off NMOS transistor 242 which isolates VBL 240 from the end 250 of the load line which is connected to the current/voltage converter circuit of FIG. 10. This causes VBL 240 to appear through transistors 244 and 246, and resistor 248 on the drain of the reference cell, where these elements are used to emulate the load line of the memory cells in the array. Transistors 244 and 246 are similar in size to the Y-multiplexer used in the memory system, and resistance 248 emulates the parasitic resistance of the load line. Transistor 252 is controlled by CrefRd signal 254 and is used to connect the drain of a reference cell to an outside pad (not shown). This allows measurement of the reference cell $V_t$ in the read mode by applying a voltage and measuring the current.

Table 5 shows the operating voltages for the read, program, erase, threshold voltage measurement operations which may be performed on a reference cell.

TABLE 5

| Operation | Source Voltage | Gate Voltage | Drain Voltage |
|---|---|---|---|
| Read | ground | 3 to 7 V | 1 V |
| Program | ground | 10 V | 5 V |
| Erase | 8 V | 0 | float |
| Measure Ref cell $V_t$ | ground | 3 to 7 V | controlled from external pad |

Figure 10:
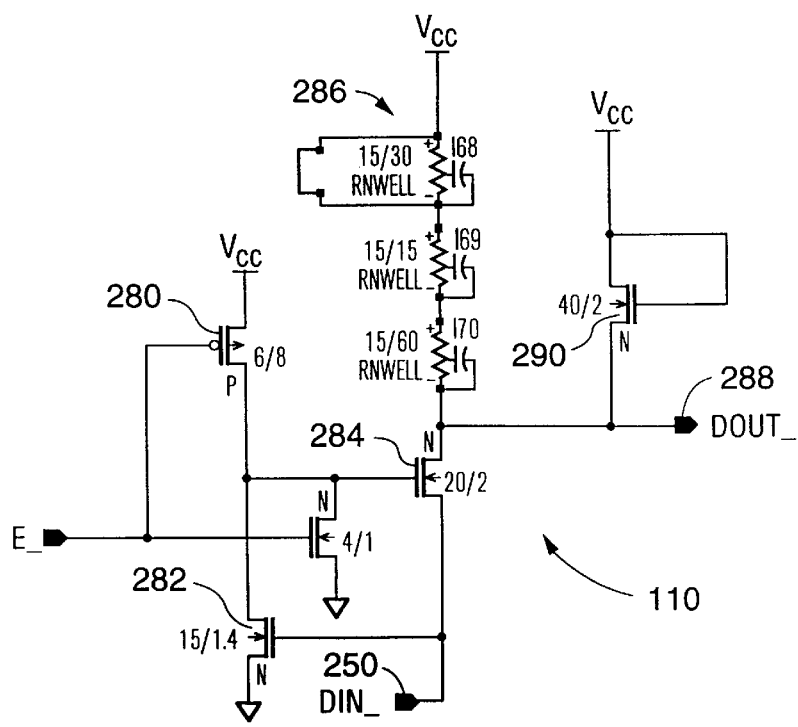
FIG. 10 is a schematic for the current/voltage converter circuit shown in FIGS. 2–4.

FIG. 10 is a schematic for current/voltage converter circuit 110 shown in FIGS. 2–4. This circuit converts the current flowing through a reference cell to a voltage signal. Converter circuit 110 is a biasing circuit composed of transistors 280, 282, and 284. These transistors provide a fairly constant bias of one volt on the-bit line or reference cell load line. The input to converter circuit 110, DIN_ 250 is the output from load control circuit 108 of FIG. 9. Resistor chain 286 is used to provide the current for operating converter 110 from the $V_{cc}$ supply voltage, and to ensure that DOUT_ 288 is proportional to the current. This provides the current to voltage conversion function. Resistor chain 286 is composed of three resistors (implemented in this case in the form of N-well resistors) so that its value can be adjusted by metal mask variations. Transistor 290 is used when converter circuit 110 is enabled to quickly charge the bit line to close to one volt.

Figure 11:
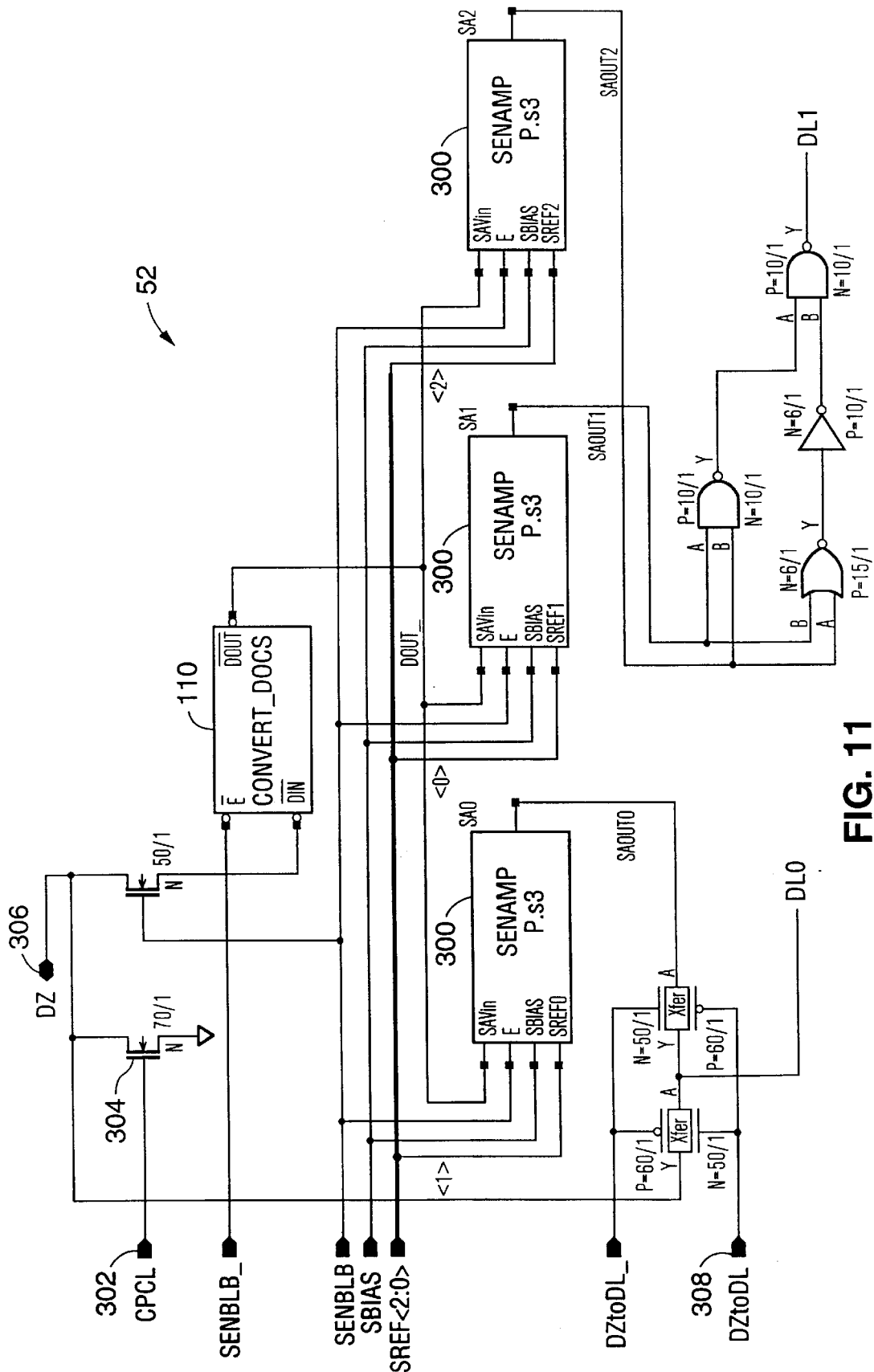
FIG. 11 is a block diagram showing the functional units of the sense amplifier module shown in FIG. 1.

FIG. 11 is a block diagram showing the functional units of sense amplifier module 52 shown in FIG. 1. As shown in FIG. 11, module 52 includes three sense amplifiers 300. Each sense amplifier 300 is a two-stage differential amplifier. SBIAS, the signal used to bias the differential amplifiers is generated outside of module 52 and can be common to all of sense amplifiers 300. Sense amplifier module 52 contains a conversion circuit 110 of the type shown in FIG. 10 for converting the current from the accessed memory cell in the array to a voltage which is applied to each of the three sense amplifiers 300 (labelled "SAVin" in the figure). The other input to sense amplifier 300 is provided by the converter outputs of the three reference cells (labelled "SREF0", "SREF1", and "SREF2" in the figure). The outputs of sense amplifiers 300 (labelled "SAOUT0", "SAOUT1", and "SAOUT2" in the figure) are gated together to provide the bit set (labelled "DL0" and "DL1" in the figure) shown in table 1. CPCL signal 302 controls a gate 304 used to discharge data line DZ 306 (connected to the bit line of the memory array) prior to performing a read operation. DZtoDL signal 308 controls a set of-gates used to bypass sense amplifier module 52. This option is used in certain test modes when it is desired to bring the memory array bit lines straight to an outside pad. This allows direct measurement of the current flowing through the memory array cells.

Table 6 shows the sense amplifier outputs (signals SAOUT2, SAOUT1, and SAOUT0) and corresponding logic values (bit set) for the memory array cell threshold voltage values for each of the states being sensed.

TABLE 6

| Cell $V_t$ | State | SAOUT2 | SAOUT1 | SAOUT0 | Bit Set (DL0/DL1) |
|---|---|---|---|---|---|
| <3 V | Erased | 1 | 1 | 1 | 1 1 |
| 4 to 4.5 V | Programmed state A | 1 | 0 | 1 | 1 0 |

TABLE 6-continued

| Cell $V_t$ | State | SAOUT2 | SAOUT1 | SAOUT0 | Bit Set (DL0/DL1) |
|---|---|---|---|---|---|
| 5 to 5.5 V | Programmed state B | 1 | 0 | 0 | 0 0 |
| >6 V | Programmed state C | 0 | 0 | 0 | 0 1 |

Note that any combination of the logic values of the bit set can be obtained by properly gating the three signals SAOUT0, SAOUT1, and SAOUT2. By using reference cell 1 with the middle trip point value as an input to sense amplifier 0, it is possible to limit the logic gate inputs to a combination of SAOUT1 and SAOUT2. The present invention thus permits a memory cell to be read with an output of two bits on two data lines indicating the cell state. The sensing module of FIG. 11 can be duplicated four times to read four memory cells at a time and output one byte of data containing the states of the cells.

Figure 12:
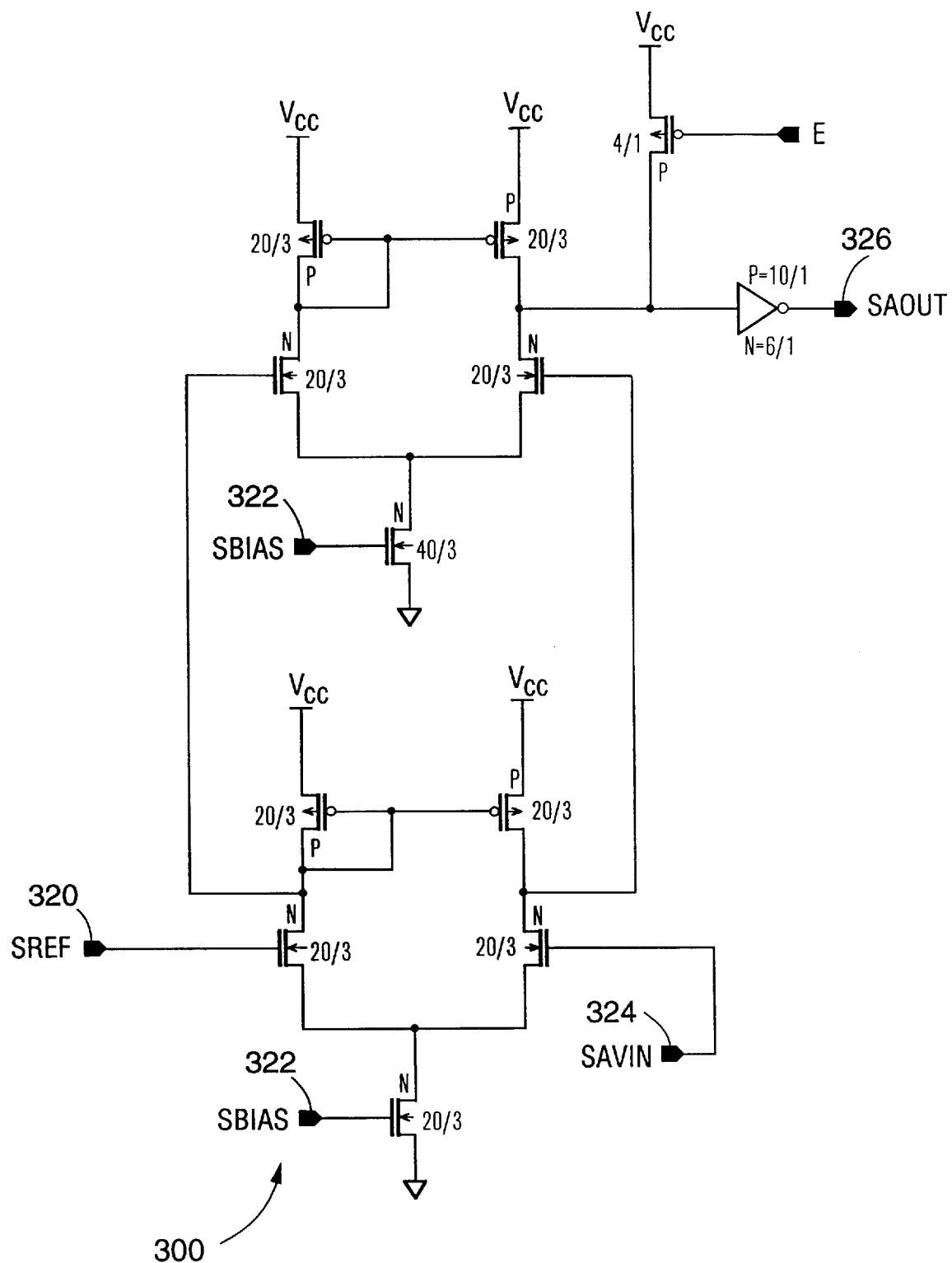
FIG. 12 is a schematic of one of the sense amplifiers shown in FIG. 11.

FIG. 12 is a schematic of one of the sense amplifiers 300 shown in FIG. 11. As noted, sense amplifier 300 is a two-stage differential amplifier. A first input to sense amplifier 300 is a reference voltage 320 (termed "SREF" in the figure) produced by the reference cells; this corresponds to signal 112 in FIGS. 2–4). A biasing voltage 322 (labelled "SBIAS" in the figure) is used to control the operation of the current mirror in sense amplifier 300. The second input to sense amplifier 300 is the voltage 324 produced by the memory cell being read (labelled "SAVin" in the figure). The output 326 of sense amplifier 300 (labelled "SAOUT" in the figure) is a signal which indicates whether the inputs compare or fail to compare.

The present invention allows the state of a memory cell to be determined in either a single cycle (for a read or erase verify operation) or only two cycles (for a programming verify operation). The values of the reference voltages used by the sense amplifiers to determine the state of the cells are provided by a set of reference cells having variable threshold voltage levels. The reference cell levels are varied by controlling the voltage applied to the gate of the reference cells. This permits a set of three reference cells (and the associated control circuits) to generate the multiple reference voltages needed to implement the programming verify, erase verify, or read operations.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A memory system comprising:
   a plurality of multistate memory cells arranged in an array of rows and columns of memory cells;
   a plurality of sense amplifiers, each sense amplifier being configured to compare a first input to a second input and produce an output indicative of which input is higher, wherein the first input to each of the sense amplifiers is a signal provided by a memory cell in the array of memory cells and the second input is one of a plurality of reference signals;
   a plurality of reference memory cells, wherein each of the reference cells has a gate node and is operable to generate one of the plurality of reference signals input to the sense amplifiers;

a reference memory cell control means operable to vary a value of the reference signals by altering a voltage applied to the gate nodes of the reference memory cells in response to a control parameter; and means for generating the control parameter.

2. The memory system of claim 1, wherein the means for generating the control parameter generates a plurality of control parameters, with each control parameter corresponding to one of a plurality of operations performed on the memory cell.

3. A circuit for determining the state of a multistate memory cell, comprising:

a plurality of sense amplifiers, each sense amplifier being configured to compare a first input to a second input and produce an output indicative of which input is higher, wherein the first input to each of the sense amplifiers is a signal provided by the memory cell and the second input is one of a plurality of reference signals;

a plurality of reference memory cells, wherein each of the reference cells has a gate node and is operable to generates one of the plurality of reference signals input to the sense amplifiers;

reference memory cell control means for altering a voltage applied to the gate nodes of the reference memory cells in response to one or more control parameters; and means for generating the one or more control parameters, with each control parameter corresponding to each one of a plurality of operations performed on the memory cell.

4. The circuit of claim 3, further comprising:

load means connected between each of the reference memory cell outputs and the second sense amplifier input of each of the plurality of sense amplifiers to provide a load substantially the same as a load on the memory cell during an operation performed on the memory cell.

5. Apparatus for determining a voltage range which includes a threshold voltage of a multistate memory cell having $2.^n$ states, comprising:

means for generating $2.^{n-1}$ lower limit reference signals, with each different lower limit signal corresponding to a lower limit of each of a plurality of voltage ranges, $2^{n-1}$ reference cells, with the means for generating comprising:

means for applying a voltage of sufficient magnitude to a gate node of each of the $2^{n-1}$ reference cells to cause the threshold voltage of each reference cell to approximately equal the lower limit of each of the plurality of voltage ranges;

means for inputting a different one of the lower limit reference signals as a first input to each of a set of $2^{n-1}$ comparators configured to compare the first input to a second input and produce an output indicative of which input is higher;

means for inputting a signal from the memory cell as the second input to each of the $2^{n-1}$ comparators;

means for comparing the first input to each of the comparators to the second input to each of the comparators in a single sensing cycle to determine the lower limit of the voltage range which includes the threshold voltage of the memory cell;

means for generating $2^{n-1}$ upper limit reference signals, with each different upper limit signal corresponding to an upper limit of each of the plurality of voltage ranges, wherein the upper limit reference signals are generated substantially simultaneously by the $2^{n-1}$ reference cells;

means for inputting a different one of the upper limit reference signals as a first input to each of the set of $2^{n-1}$ comparators; and means for comparing the first input to each of the comparators to the second input to each of the comparators in a single sensing cycle to determine the upper limit of the voltage range which includes the threshold voltage of the memory cell, thereby determining the upper and lower limits and hence the voltage range which includes the threshold voltage of the memory cell.

6. The apparatus of claim 5, wherein the means for generating the $2^{n-1}$ upper limit reference signals further comprises:

means for applying a voltage of sufficient magnitude to a gate node of each of the $2^{n-1}$ reference cells to cause the threshold voltage of each reference cell to approximately equal the upper limit of each of the plurality of voltage ranges.

7. The apparatus of claim 6, wherein n equals 2.

8. Apparatus for determining a lower limit of a voltage range which includes a threshold voltage of a multistate memory cell having $2^n$ states, comprising:

means for substantially simultaneously generating $2^{n-1}$ lower limit reference signals, with each different lower limit signal corresponding to a lower limit of each of a plurality of voltage ranges, the means comprising:

$2^{n-1}$ reference cells;

means for applying a voltage of sufficient magnitude to a gate node of each of the $2^{n-1}$ reference cells to cause the threshold voltage of each reference cell to approximately equal the lower limit of each of the plurality of voltage ranges;

means for inputting a different one of the lower limit reference signals as a first input to each of a set of $2^{n-1}$ comparators configured to compare the first input to a second input and produce an output indicative of which input is higher;

means for inputting a signal from the memory cell as the second input to each of the $2^{n-1}$ comparators; and means for comparing the first input to each of the comparators to the second input to each of the comparators in a single sensing cycle to determine the lower limit of the voltage range which includes the threshold voltage of the memory cell.

9. The apparatus of claim 8, wherein n equals 2.

10. Apparatus for determining an upper limit of a voltage range which includes a threshold voltage of a multistate memory cell having $2^n$ states, comprising:

means for generating $2^{n-1}$ upper limit reference signals, with each different upper limit signal corresponding to an upper limit of each of a plurality of voltage ranges, with the means for generating comprising:

$2^{n-1}$ reference cells;

means for applying a voltage of sufficient magnitude to a gate node of each of the $2^{n-1}$ reference cells to cause the threshold voltage of each reference cell to approximately equal the upper limit of each of the plurality of voltage ranges;

means for inputting a different one of the upper limit reference signals as a first input to each of a set of $2^{n-1}$ comparators configured to compare the first input to a second input and produce an output indicative of which input is higher;

means for inputting a signal from the memory cell as the second input to each of the $2^{n-1}$ comparators; and means for comparing the first input to each of the comparators to the second input to each of the comparators in a single sensing cycle to determine the upper limit of the voltage range which includes the threshold voltage of the memory cell.

11. The apparatus of claim 10, wherein n equals 2.

12. Apparatus for determining the state of a multistate memory cell which stores n bits of data in $2^n$ possible states, with each of the possible states having a one-to-one correspondence with $2^n$ ranges of threshold voltages of the memory cell, the apparatus comprising:

means for generating $2^{n-1}$ read operation reference signals, with each different read operation signal corresponding to a threshold voltage value falling between an upper limit of a first one of the $2^n$ threshold voltage ranges and a lower limit of a second one of the $2^n$ threshold voltage ranges which is greater than the upper limit of the first range, with the means for generating comprising:

$2^{n-1}$ reference cells;

means for applying a voltage of sufficient magnitude to a gate node of each of the $2^{n-1}$ reference cells to cause the threshold voltage of each reference cell to approximately equal one of the $2^{n-1}$ read operation signals;

means for inputting a different one of the read operation reference signals as a first input to each of a set of $2^{n-1}$ comparators configured to compare the first input to a second input and produce an output indicative of which input is higher;

means for inputting a signal from the memory cell as the second input to each of the $2^{n-1}$ comparators; and means for comparing the first input to each of the comparators to the second input to each of the comparators in a single sensing cycle to determine a range of read operation values which includes the threshold voltage of the memory cell, thereby determining the state of the memory cell.

13. The apparatus of claim 12, wherein n equals 2.

14. Apparatus for determining which of a plurality of voltage ranges corresponds to a threshold voltage of a multistate memory cell having four or more states, the apparatus comprising:

means for establishing an upper or lower limit reference signal corresponding to an upper or lower limit of one the voltage ranges;

means for comparing the limit reference signal to a signal based on the threshold voltage of the memory cell; and means for changing the limit reference signal to correspond to an upper or lower limit of another one of the voltage ranges.

15. The apparatus of claim 14:

wherein the means for establishing the upper or lower limit reference signal includes a reference memory cell having a cell bias voltage which at least partly determines the upper or lower limit reference signal; and wherein the means for changing the limit reference signal to correspond to an upper or lower limit of another one of the voltage ranges includes means for changing the cell bias voltage of the reference memory cell.

16. The apparatus of claim 15 wherein the means for comparing the limit reference signal to a signal based on the threshold voltage of the memory cell makes its comparison during one sensing cycle, and the apparatus further includes:

means for comparing the changed limit reference signal to the signal based on the threshold voltage of the memory cell during the one sensing cycle.

17. Apparatus for verifying a state of a memory cell having four or more states which correspond with a plurality of voltage ranges, the apparatus comprising:

means for establishing an upper or lower limit reference signal corresponding to a first upper or lower limit of one of the voltage ranges, wherein establishing the upper or lower limit reference signal includes providing a reference memory cell having a cell bias voltage which at least partly determines the upper or lower limit reference signal;

means for comparing the limit reference signal to a signal based on the state of the memory cell;

means for changing the limit reference signal to correspond to a second upper or lower limit of another one of the voltage ranges, wherein changing the limit reference signal includes changing the cell bias voltage of the reference memory cell; and means for comparing the changed limit reference signal to the signal based on the state of the memory cell.

18. A memory system comprising:

a plurality of memory cells for storing user data and providing a plurality of corresponding memory signals;

one or more reference cells for providing one or more corresponding reference signals, with each reference cell having a gate and a source and each reference signal based on a corresponding reference cell bias voltage;

differential amplification means, including a first input for receiving at least one of the memory signals, a second input for receiving at least one of the reference signals, for producing a signal based on the one memory signal and the one reference signal; and adjustable bias means coupled to the gate or source of one or more of the reference cells to adjust one or more of the corresponding bias voltages and one or more of the corresponding reference signals based on a control parameter.

19. A memory system comprising:

a plurality of memory cells for storing user data and providing a plurality of corresponding memory signals;

one or more reference cells for providing one or more corresponding reference signals, with each reference cell having a gate and a source and each reference signal based on a corresponding reference cell bias voltage;

one or more differential amplifiers, with each amplifier having a first input for receiving at least one of the memory signals, a second input for receiving at least one of the reference signals, and an output for producing a signal based on the one memory signal and the one reference signal; and adjustable bias means coupled to the gate or source of one or more of the reference cells to adjust one or more of the corresponding bias voltages and one or more of the corresponding reference signals based on a control parameter.

20. A memory system comprising:

a plurality of memory cells for storing user data and providing a plurality of corresponding memory signals;

at least three reference cells for providing at least three corresponding reference signals, with each reference cell having a gate and a source and each reference signal based on a corresponding reference cell bias voltage;

one or more differential amplifiers, with each amplifier having a first input for receiving at least one of the memory signals, a second input for receiving at least one of the reference signals, and an output for producing a signal based on the one memory signal and the one reference signal; and an adjustable bias-voltage circuit coupled to the gate or source of one or more of the reference cells to adjust one or more of the corresponding bias voltages and one or more of the corresponding reference signals based on a control parameter, wherein the adjustable bias-voltage circuit includes at least three gate control means each coupled to the gate of one of the reference cells to control the gate voltage of the one reference cell and at least three source control means each coupled to the source of one of the reference cells to control the source voltage of the one of the reference cells.

21. A memory system comprising:

a plurality of memory cells for storing user data and providing a plurality of corresponding memory signals;

one or more reference cells for providing corresponding reference cell currents, with each reference cell having a gate and a source and each reference current based on a corresponding reference cell bias voltage;

current-to-voltage conversion means coupled to a corresponding one of the reference cells to convert a corresponding reference cell current to a corresponding reference voltage;

differential amplification means for producing a signal based on at least one of the memory signals and at least one of the reference voltages;

adjustable bias-voltage means coupled to the gate or source of one or more of the reference cells to adjust one or more of the corresponding bias voltages and one or more of the corresponding reference voltages based on a control parameter; and means for controlling the adjustable bias-voltage means based on the control parameter.

* * * * *

UNITED STATES PATENT AND TRADEMARK OFFICE
CERTIFICATE OF CORRECTION

PATENT NO. : 6,324,094 B1
DATED : November 27, 2001
INVENTOR(S) : Chevallier

Page 1 of 1

It is certified that error appears in the above-identified patent and that said Letters Patent is hereby corrected as shown below:

Column 4,
Line 16, delete "38contains" and insert -- 38 contains --, therefor.
Line 19, after "cases" insert -- , --.

Column 10,
Line 43, delete "08/640, 456," and insert -- 08/640,456, --, therefor.

Column 11,
Line 52, delete "changing- the" and insert -- changing the --, therefor.

Column 15,
Line 24, delete "generates" and insert -- generate --, therefor.
Line 43, delete "2.$^n$" and insert -- $2^n$ --, therefor.
Line 44, delete "2.$^{n-1}$" and insert -- $2^{n-1}$ --, therefor.

Signed and Sealed this

Twenty-third Day of April, 2002

Attest:

*Attesting Officer*

JAMES E. ROGAN
*Director of the United States Patent and Trademark Office*